United States Patent
Asnaashari et al.

(10) Patent No.: US 9,165,653 B2
(45) Date of Patent: *Oct. 20, 2015

(54) DETERMINING SECTOR STATUS IN A MEMORY DEVICE

(75) Inventors: Mehdi Asnaashari, Danville, CA (US); Yu-Song Liao, San Jose, CA (US); Siamack Nemazie, Los Altos Hills, CA (US)

(73) Assignee: Micron Technology, Inc., Boise, ID (US)

( * ) Notice: Subject to any disclaimer, the term of this patent is extended or adjusted under 35 U.S.C. 154(b) by 519 days.

This patent is subject to a terminal disclaimer.

(21) Appl. No.: 13/617,931

(22) Filed: Sep. 14, 2012

(65) Prior Publication Data

US 2013/0013978 A1    Jan. 10, 2013

Related U.S. Application Data

(63) Continuation of application No. 12/364,900, filed on Feb. 3, 2009, now Pat. No. 8,276,042.

(51) Int. Cl.
| | | |
|---|---|---|
| *G06F 11/00* | (2006.01) | |
| *G11C 16/06* | (2006.01) | |
| *G06F 11/10* | (2006.01) | |
| *G11C 29/04* | (2006.01) | |

(52) U.S. Cl.
CPC ............ *G11C 16/06* (2013.01); *G06F 11/1012* (2013.01); *G11C 29/04* (2013.01); *G11C 2029/0411* (2013.01)

(58) Field of Classification Search
CPC ............ G06F 11/1048; G06F 12/0246; G06F 2212/1032; G06F 11/1012; G06F 11/1072; G06F 11/1008; G06F 11/1405
USPC .......................................... 714/763–768, 779
See application file for complete search history.

(56) References Cited

U.S. PATENT DOCUMENTS

| | | | |
|---|---|---|---|
| 5,388,083 | A | 2/1995 | Assar et al. |
| 5,455,721 | A | 10/1995 | Nemazie et al. |
| 5,479,638 | A | 12/1995 | Assar et al. |
| 5,485,595 | A | 1/1996 | Assar et al. |
| 5,523,979 | A | 6/1996 | Nemazie |
| 5,564,055 | A | 10/1996 | Asnaashari et al. |
| 5,696,775 | A | 12/1997 | Nemazie et al. |
| 5,768,043 | A | 6/1998 | Nemazie et al. |
| 5,848,438 | A | 12/1998 | Nemazie et al. |
| 5,864,568 | A | 1/1999 | Nemazie |
| 5,928,370 | A | 7/1999 | Asnaashari |
| 6,025,966 | A | 2/2000 | Nemazie et al. |
| 6,076,137 | A | 6/2000 | Asnaashari |
| 6,088,262 | A | 7/2000 | Nasu |
| 6,134,151 | A | 10/2000 | Estakhri et al. |
| 6,314,480 | B1 | 11/2001 | Nemazie et al. |
| 6,327,639 | B1 | 12/2001 | Asnaashari |
| 6,411,546 | B1 | 6/2002 | Estakhri et al. |

(Continued)

*Primary Examiner* — Bryce Bonzo
*Assistant Examiner* — Elmira Mehrmanesh
(74) *Attorney, Agent, or Firm* — Brooks, Cameron & Huebsch, PLLC

(57) ABSTRACT

The present disclosure includes methods, devices, modules, and systems for operating semiconductor memory. A number of method embodiments include reading data from memory cells corresponding to a sector of data, determining a number of the memory cells in a non-erased state, and, if the number of the memory cells in a non-erased state is less than or equal to a number of errors correctable by an ECC engine, determining the sector is erased.

20 Claims, 6 Drawing Sheets

(56) References Cited

U.S. PATENT DOCUMENTS

| | | |
|---|---|---|
| 6,560,055 B1 | 5/2003 | Nemazie et al. |
| 6,587,382 B1 | 7/2003 | Estakhri et al. |
| 6,594,716 B2 | 7/2003 | Nemazie et al. |
| 6,694,402 B1 | 2/2004 | Muller |
| 6,728,913 B1 | 4/2004 | Parker |
| 6,986,092 B2 | 1/2006 | Butler et al. |
| 7,009,889 B2 | 3/2006 | Tran et al. |
| 7,102,671 B1 | 9/2006 | Asnaashari |
| 7,155,559 B1 | 12/2006 | Estakhri et al. |
| 7,313,024 B2 | 12/2007 | Lee |
| 7,437,498 B2 | 10/2008 | Ronen |
| 7,450,435 B2 | 11/2008 | Tran et al. |
| 7,463,532 B2 | 12/2008 | Tran et al. |
| 7,653,863 B2 | 1/2010 | Villa |
| 7,853,841 B2 | 12/2010 | Aritome |
| 7,904,788 B2 | 3/2011 | Brandman et al. |
| 8,448,046 B2 * | 5/2013 | Hung .......................... 714/768 |
| 2001/0056511 A1 | 12/2001 | Nemazie et al. |
| 2005/0219909 A1 | 10/2005 | Futatsuyama et al. |
| 2006/0010271 A1 | 1/2006 | Nemazie et al. |
| 2006/0098493 A1 | 5/2006 | Tran et al. |
| 2006/0133141 A1 | 6/2006 | Gorobets |
| 2006/0133156 A1 | 6/2006 | Tran et al. |
| 2006/0161703 A1 | 7/2006 | Nemazie et al. |
| 2006/0291289 A1 | 12/2006 | Lee |
| 2007/0124533 A1 | 5/2007 | Estakhri et al. |
| 2008/0107275 A1 | 5/2008 | Asnaashari |
| 2008/0301524 A1 | 12/2008 | Horisaki et al. |
| 2010/0058119 A1 | 3/2010 | Reid |
| 2010/0064096 A1 | 3/2010 | Weingarten et al. |

* cited by examiner

| HEADER | PAYLOAD | EXTENSION | ERROR CORRECTION |
| 226 | 227 | 228 | 229 |

DETERMINING SECTOR STATUS IN A MEMORY DEVICE

PRIORITY APPLICATION INFORMATION

This application is a Continuation of U.S. application Ser. No. 12/364,900 filed Feb. 3, 2009 and issued Sep. 25, 2012 as U.S. Pat. No. 8,276,042, the specification of which is incorporated herein by reference.

TECHNICAL FIELD

The present disclosure relates generally to semiconductor memory devices, methods, and systems, and more particularly, to operating semiconductor memory.

BACKGROUND

Memory devices are typically provided as internal, semiconductor, integrated circuits in computers or other electronic devices. There are many different types of memory, including volatile and non-volatile memory. Volatile memory can require power to maintain its data and can include random-access memory (RAM), dynamic random access memory (DRAM), and synchronous dynamic random access memory (SDRAM), among others. Non-volatile memory can provide persistent data by retaining stored information when not powered and can include NAND flash memory, NOR flash memory, read only memory (ROM), Electrically Erasable Programmable ROM (EEPROM), Erasable Programmable ROM (EPROM), and phase change random access memory (PCRAM), among others.

Memory devices can be combined together to form a solid state drive (SSD). An SSD can include non-volatile memory, e.g., NAND flash memory and NOR flash memory, and/or can include volatile memory, e.g., DRAM and SRAM, among various other types of non-volatile and volatile memory.

An SSD may be used to replace hard disk drives as the main storage device for a computer, as the SSD may have advantages over hard drives in terms of, for example, performance, size, weight, ruggedness, operating temperature range, and power consumption. For example, SSDs may have superior performance when compared to magnetic disk drives due to their lack of moving parts, which may ameliorate seek time, latency, and other electro-mechanical delays associated with magnetic disk drives. SSD manufacturers can use non-volatile flash memory to create flash SSDs that may not use an internal battery supply, thus allowing the drive to be more versatile and compact.

An SSD may include a number of memory devices, e.g., a number of memory chips (as used herein, "a number of" something can refer to one or more such things; e.g., a number of memory devices can refer to one or more memory devices). As one of ordinary skill in the art will appreciate, a memory chip may include a number of dies. Each die may include a number of memory arrays and peripheral circuitry thereon. A memory array may include a number of planes, with each plane including a number of physical blocks of memory cells. Each physical block may include a number of pages of memory cells that can store a number of sectors of data.

DETAILED DESCRIPTION

Figure 1:
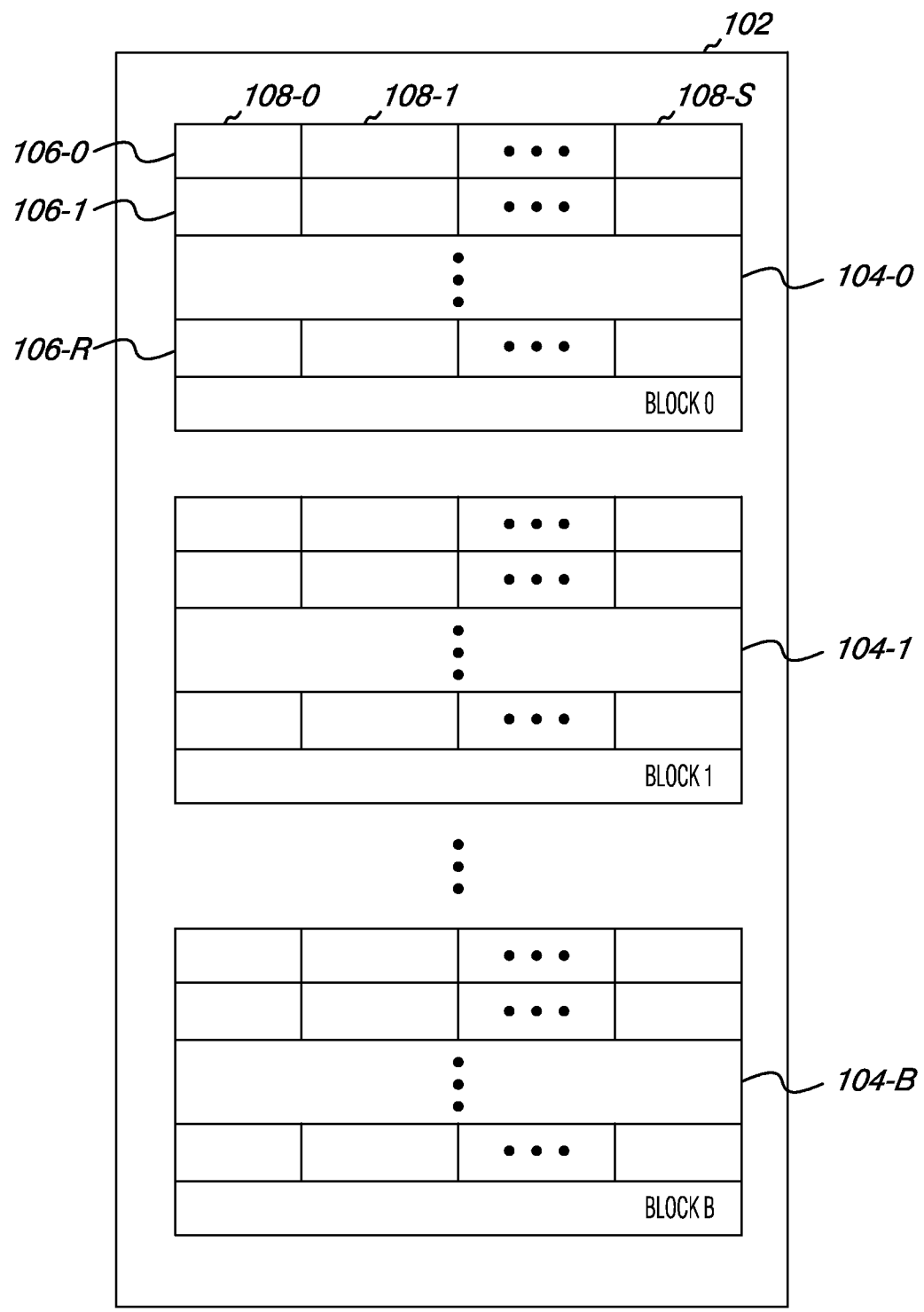
FIG. 1 illustrates a diagram of a memory array that includes multiple physical blocks and can be operated in accordance with a number of embodiments of the present disclosure.

The present disclosure includes methods, devices, and systems for operating semiconductor memory. A number of method embodiments include reading data from memory cells corresponding to a sector of data, determining a number of the memory cells in a non-erased state, and, if the number of the memory cells in a non-erased state is less than or equal to a number of errors correctable by an ECC engine, determining the sector is erased.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "B", "R", and "S", particularly with respect to reference numerals in the drawings, indicate that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, 110 may reference element "10" in FIG. 1, and a similar element may be referenced as 210 in FIG. 2. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present invention, and should not be taken in a limiting sense.

FIG. 1 illustrates a diagram of a memory array 102 that includes multiple physical blocks 104-0 (BLOCK 0), 104-1 (BLOCK 1), ..., 104-B (BLOCK B) and can be operated in accordance with a number of embodiments of the present disclosure. Although not shown in FIG. 1, one of ordinary skill in the art will appreciate that array 102 can be located on a particular semiconductor die along with various peripheral circuitry associated with the operation thereof.

In the example shown in FIG. 1, the indicator "B" is used to indicate that array 102 can include a number of physical blocks. As an example, the number of physical blocks in array 102 can be 128 blocks, 512 blocks, or 1,024 blocks, but embodiments are not limited to a particular multiple of 128 or to any particular number of physical blocks in an array 102. Further, embodiments are not limited to the type of memory used in the array, e.g., non-volatile, volatile, etc. In the embodiment illustrated in FIG. 1, the memory array 102 can be, for example, a NAND flash memory array 102.

In this example, each physical block 104-0, 104-1, . . . , 104-B includes memory cells which can be erased together as a unit, e.g., the cells in each physical block can be erased in a substantially simultaneous manner. For instance, the cells in each physical block can be erased together in a single operation. Each physical block, e.g., 104-0, 104-1, . . . , 104-B, contains a number of physical rows, e.g., 106-0, 106-1, . . . , 106-R, of memory cells coupled to an access line, e.g., a word line. The indicator "R" is used to indicate that a physical block, e.g., 104-0, 104-1, . . . , 104-B, can include a number of rows. In a number of embodiments, the number of rows, e.g., word lines, in each physical block can be 32, but embodiments are not limited to a particular number of rows 106-0, 106-1, . . . , 106-R per physical block. The use of the term "row" is not meant to imply a particular linear and/or horizontal orientation of the memory cells. Rather, a row can mean a number of memory cells coupled to a particular word line, regardless of the orientation of the memory cells. For example, a row can include a number of memory cells coupled to a particular word line in a staggered, non-linear orientation.

As one of ordinary skill in the art will appreciate, each row 106-0, 106-1, 106-R can store a number of pages of data. A page refers to a unit of programming and/or reading, e.g., a number of cells, or portions of data stored thereon, that can be programmed and/or read together or as a functional group. In the embodiment shown in FIG. 1, each row 106-0, 106-1, . . . , 106-R can store one page of data. However, embodiments of the present disclosure are not so limited. For example, in a number of embodiments, each row can store multiple pages of data (e.g., where each cell in the row contributes data to each of the multiple pages).

In a number of embodiments of the present disclosure, and as shown in FIG. 1, a page associated with the rows 106-0, 106-1, . . . , 106-R can store data in accordance with a number of physical sectors 108-0, 108-1, . . . , 108-S of data. The indicator "S" is used to indicate that a row, e.g., 106-0, 106-1, . . . , 106-R, can include a number of physical sectors. Each physical sector 108-0, 108-1, . . . , 108-S can correspond to a logical sector and can include overhead information, such as error correction code (ECC) information and logical block address (LBA) information, as well as user data. As one of ordinary skill in the art will appreciate, logical block addressing is a scheme often used by a host for identifying a logical sector of information. As an example, a logical sector can store information representing a number of bytes of data, e.g., 256 bytes, 512 bytes, or 1,024 bytes. However, embodiments of the present disclosure are not limited to these examples.

It is noted that other formats and/or configurations for the physical blocks 104-0, 104-1, . . . , 104-B, rows 106-0, 106-1, . . . , 106-R, sectors 108-0, 108-1, . . . , 108-S, and pages are possible. For example, the rows 106-0, 106-1, . . . , 106-R of the physical blocks 104-0, 104-1, . . . , 104-B can include a single logical sector which can include, for example, more or less than 512 bytes of data.

In a number of embodiments, a logical sector of data can have a status associated therewith. The status of a logical sector can be based on, e.g., can depend at least partially on, the state of the memory cells corresponding to the logical sector. For example, in a number of embodiments, if all of the memory cells corresponding to a logical sector are in an erased state, e.g., if no memory cells corresponding to the logical sector are in a non-erased, e.g., programmed, state, the logical sector has a status of erased. In a number of embodiments, if a number of memory cells corresponding to the logical sector in a non-erased state exceed a number of errors correctable by an ECC engine, the logical sector has a status of non-erased if data read from the memory cells corresponding to the logical sector includes a number of correctable errors, and the errors are corrected or if the ECC engine determines that the read data is uncorrectable.

Figure 2:
FIG. 2 illustrates an example of data that can be used in accordance with a number of embodiments of the present disclosure.

FIG. 2 illustrates an example of data 222 that can be used in accordance with a number of embodiments of the present disclosure. In a number of embodiments, data 222 data can be intermediary data presented to an error correction code (ECC) engine, such as ECC engine 345 shown in FIG. 3, during a read operation. In the embodiment shown in FIG. 2, data 222 includes a header portion 226, a payload portion 227, an extension portion 228, and an error correction portion 229. In a number of embodiments, data 222 can be associated with a number of physical sectors 122-0, 122-1, . . . , 122-S shown in FIG. 1, e.g., a number of the portions included in data 222 can be associated with a number of physical sectors 122-0, 122-1, . . . , 122-N. However, data 222 is not a direct representation of a number of physical sectors 122-0, 122-1, . . . , 122-N.

In a number of embodiments, payload portion 227 can include data stored in a number of memory cells corresponding to a logical sector. For instance, the payload portion can be data associated with a particular operation, e.g., data associated with a particular program and/or read operation performed on the number of memory cells. The number of memory cells can be located in an array of memory cells, e.g., memory array 102 shown in FIG. 1.

In a number of embodiments, header portion 226 and extension portion 228 can include data relating to payload portion 227 and/or the number of memory cells whose data is stored in payload portion 227. For example, header portion 226 and/or extension portion 228 can include data representing a logical block address (LBA) of the number of memory cells corresponding to a logical sector whose data is stored in payload portion 227. Header portion 226 may not be included in data 222 in a number of embodiments, e.g., header portion 226 can be optional. Header portion 226 can be used as part of an error correction code (ECC) computation, but header portion 226 is not programmed as part of a physical sector, e.g., physical sectors 108-0, 108-1, . . . , 108-S, of a memory array.

In a number of embodiments, error correction portion 229 can include data used to detect and/or correct errors associated with the number of memory cells whose data is stored in payload portion 227, extension portion 228, and/or error correction portion 229. For example, error correction portion 229 can include an error correction code (ECC) syndrome. An ECC syndrome can be data used in association with an ECC engine to indicate whether an error has occurred. The ECC engine can generate the ECC syndrome during a program operation. An ECC syndrome can be based on the data included in header portion 226, payload portion 227, and/or extension portion 228.

Although the embodiment shown in FIG. 2 illustrates data 222 including header portion 226, payload portion 227, extension portion 228, and error correction portion 229, embodiments of the present disclosure are not so limited. For instance, header portion 226 and/or extension portion 228 may not be included in data 222 in a number of embodiments. As an example, in a number of embodiments, data 222 can include payload portion 227 and error correction portion 229 only, or payload portion 227, error correction portion 229, and a number of header portion 226 and extension portion 228. Also, in a number of embodiments, data 222 can include portions other than header portion 226, payload portion 227, extension portion 228, and error correction portion 229. Additionally, in a number of embodiments, header portion 226, payload portion 227, extension portion 228, and/or error correction portion 229 can be added to and/or removed from data 222 at various points in time, as will be described further in connection with FIG. 3.

Figure 3:
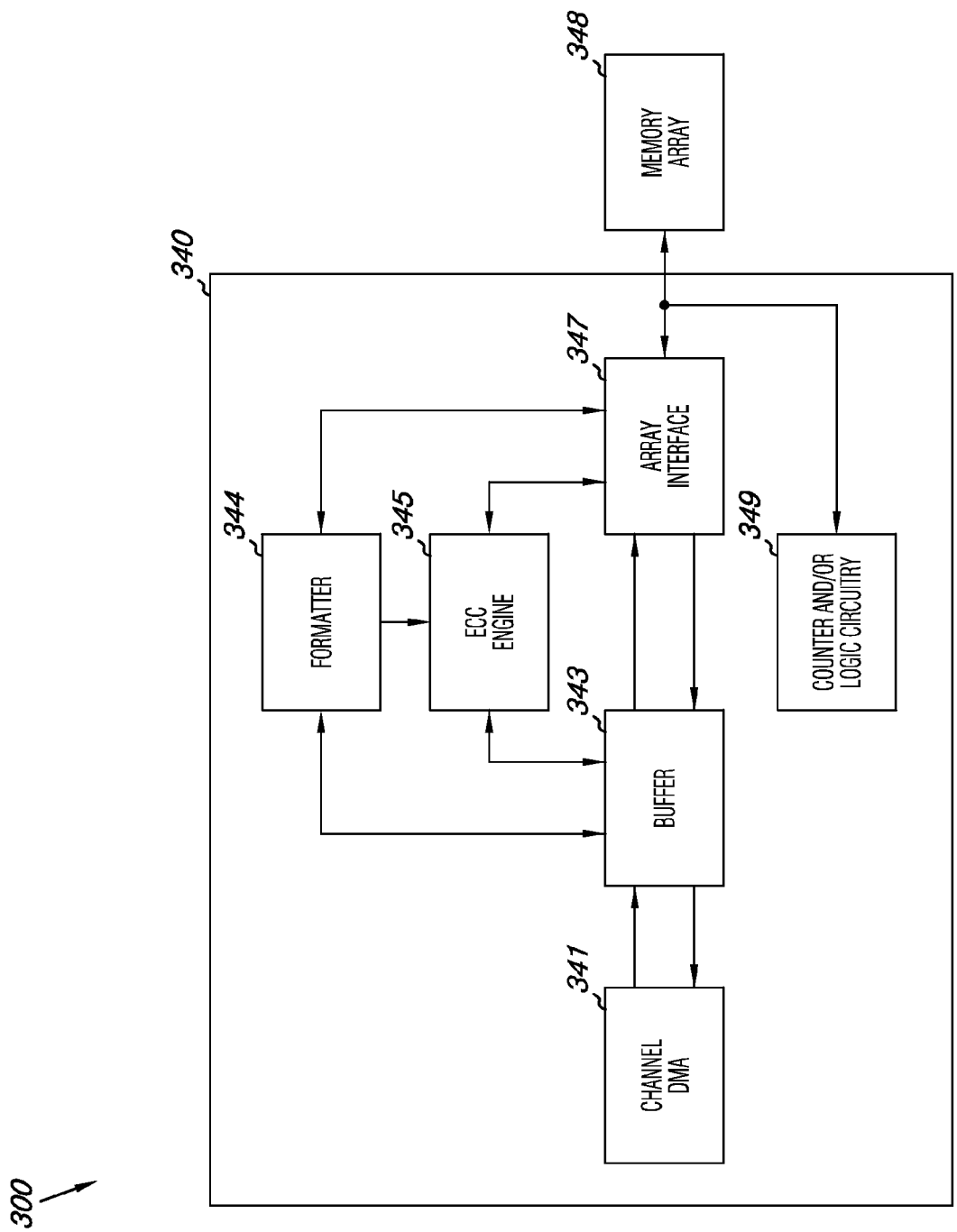
FIG. 3 illustrates a functional block diagram of a portion of a memory device that can be operated in accordance with a number of embodiments of the present disclosure.

FIG. 3 illustrates a functional block diagram of a portion of a memory device 300 that can be operated in accordance with a number of embodiments of the present disclosure. In a number of embodiments, memory device 300 can be a solid state memory device, such as a solid state drive or other solid state memory device. As shown in FIG. 3, memory device 300 includes memory controller portion 340 and memory array 348. Memory array 348 can be, for example, memory array 102 shown in FIG. 1. In a number of embodiments, memory controller portion 340 can be a channel used by a memory controller to communicate with a number of memory arrays e.g., memory array 348. In a number of embodiments, memory controller portion 340 can be used to determine a status of a number of logical sectors of data associated with memory array 348.

As shown in FIG. 3, memory controller portion 340 includes channel direct memory access (DMA) 341. Channel DMA 341 can receive data from and send data to another device, such as a computing device (not shown in FIG. 3). Channel DMA 341 can also send data to and receive data from memory array 348 via the paths indicated by the arrows shown in FIG. 3. For example, during a programming operation, channel DMA 341 can receive data from the computing device representing a state(s) to which the memory cells in array 348 are to be programmed, and can then send this data to data buffer 343, which can send the data to memory array 348 via the paths indicated by the arrows shown in FIG. 3. Channel DMA 341 can also receive via the paths indicated by the arrows shown in FIG. 3 data representing a state(s) of the memory cells in array 348 read during a read operation, and can then send this data to the computing device. In a number of embodiments, the data received and/or sent by channel DMA 341 can include data representing a state(s) of a number of memory cells in array 348 which correspond to a number of logical sectors. For example, the data received and/or sent by channel DMA 341 can include a payload portion, such as payload portion 227 of data 222 shown in FIG. 2.

During a programming operation, formatter 344 can send a header portion to error correction code (ECC) engine 345. In a number of embodiments, the header portion can be optional, e.g., formatter 344 may not send a header portion to ECC engine 345 during the programming operation. A sector of data, e.g., data received from channel DMA 341, can then be sent from data buffer 343 to ECC engine 345 and array interface 347. Formatter 344 can then send an extension portion to ECC engine 345 and array interface 347. Finally, ECC engine 345 can generate an error correction portion, and can send the error correction portion to array interface 347. As an example, the header portion, sector of data, extension portion, and/or error correction portion can be header portion 226, payload portion 227, extension portion 228, and/or error correction portion 229 shown in FIG. 2. Payload portion 227, extension portion 228, and/or error correction portion 229 can then be programmed as part of a physical sector, e.g., physical sectors 108-0, 108-1, . . . , 108-S shown in FIG. 1, of a memory array.

During a read operation, data representing a state(s) of the memory cells in array 348 corresponding to a number of physical sectors can be read. In a number of embodiments, data representing a state(s) of a number of memory cells in array 348 corresponding to a number of physical sectors can correspond to a number of logical sectors. During a read operation, formatter 344 can send a header portion to ECC engine 345. In a number of embodiments, the header portion can be optional, e.g., formatter 344 may not send a header portion to ECC engine 345 during the read operation. The read physical sector including the payload portion, extension portion, and/or error correction portion can then be sent from memory array 348 to ECC engine 345 and data buffer 343. As an example, the read physical sector can include payload portion 227, extension portion 228, and/or error correction portion 229 shown in FIG. 2.

Counter and/or logic circuitry 349 can be configured to determine whether all the memory cells corresponding to the sector are in an erased state, e.g., whether a number of the memory cells are in a non-erased state, based on the read data. The logic circuitry can include, for example, All_Bytes_FF logic. However, embodiments of the present disclosure are not so limited, and can include any type of logic circuitry that can determine whether all the memory cells corresponding to a particular physical sector are in an erased state. The counter can determine, e.g., count, the number of memory cells corresponding to the physical sector that are in a non-erased state.

ECC engine 345 can detect errors in the read physical sector, can determine whether there are any errors, whether the errors are correctable, and/or can correct the errors if the errors are correctable. ECC engine 345 can also detect errors in the header portion. ECC engine 345 can send the corrected data to data buffer 343.

One of ordinary skill in the art will appreciate that ECC engines such as ECC engine 345 may be capable of detecting and/or correcting up to, for example, 8, 16, and/or 32 errors per physical sector. In a number of embodiments, the number of errors the ECC engine is capable of detecting and/or correcting can be given by $$(D_{min}-1)/2$$

where Dmin is a minimum distance of a code, e.g., block code, associated with the ECC engine. For example, Dmin of two block codes can be the number of locations which differ between the two block codes. However, embodiments are not limited to a particular number of errors correctable by an ECC engine.

Memory controller portion 340 can use the information determined by counter and/or logic circuitry 349 and information regarding the error corrections performed by ECC engine 345 to determine whether the number of corrected errors is equal to the number of memory cells corresponding to the sector that were determined to be in the non-erased state. For example, memory controller portion 340 can compare the number of corrected errors to the number of memory cells corresponding to the sector that were determined to be in the non-erased state, and can determine whether the two numbers are equal. If the number of corrected errors is equal to the number of memory cells determined to be in the non-erased state, memory controller portion 340 can provide an indicator having a status indicating the sector is erased. This indicator can be provided by, for example, counter and/or logic circuitry 349. Memory controller portion 340 can also reset the header portion, e.g., set the bits in the header portion to "1", in response to a determination by ECC engine 345 that an error in the read physical sector is uncorrectable. Memory controller 340 can then read the same physical sector to determine the status of the sector.

Figure 4:
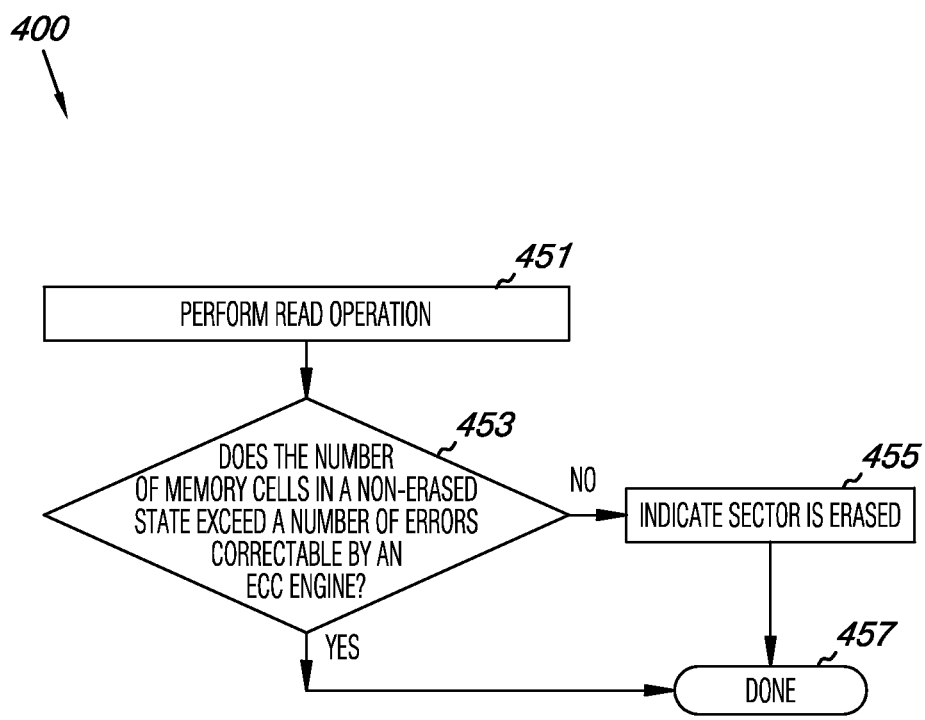
FIG. 4 is a flow chart illustrating a method for operating a memory device in accordance with a number of embodiments of the present disclosure.

FIG. 4 is a flow chart 400 illustrating a method for operating a memory device, e.g., memory device 300 shown in FIG. 3, in accordance with a number of embodiments of the present disclosure. In a number of embodiments, the memory device can be a solid state memory device, such as a solid state drive or other solid state memory device. In a number of embodiments, the method illustrated by flow chart 400 can be used to determine a status of a number of logical sectors of data associated with a memory array, e.g., memory array 102 shown in FIG. 1 and/or memory array 348 shown in FIG. 3.

At step 451, a read operation is performed on a memory array. In a number of embodiments, the read operation can be performed on a number of memory cells corresponding to a logical sector of data, e.g., a logical sector corresponding to one of physical sectors 122-0, 122-1, . . . , 122-S shown in FIG. 1 and/or a logical sector associated with data 222 shown in FIG. 2. In a number of embodiments, the logical sector can be associated with a payload portion and/or an extension portion. For example, the logical sector can be associated with payload portion 227 and/or extension portion 228 shown in FIG. 2. However, the logical sector is not associated with a header portion.

If the read operation determines at step 453 that the number of memory cells in a non-erased state is less than or equal to, e.g., does not exceed, a number of errors correctable by an ECC engine, e.g., ECC engine 345 shown in FIG. 3, it is determined that the sector is in an erased state and an indicator having a status indicating the sector is erased is provided at step 455, and the operation is concluded at step 457. The indicator can be provided by, for example, counter and/or logic circuitry 349 shown in FIG. 3. If the read operation determines at step 453 that the number of memory cells in a non-erased state is greater than, e.g., exceeds, the number of errors correctable by an ECC engine, it can not be determined that the sector is in an erased state and an indicator having a status indicating the sector is erased is not provided, and the operation is concluded at step 457. In a number of embodiments, whether the number of memory cells in a non-erased state exceeds a number of errors correctable by the ECC engine can be determined by a module, such as counter and/or logic circuitry 349 shown in FIG. 3.

Figure 5:
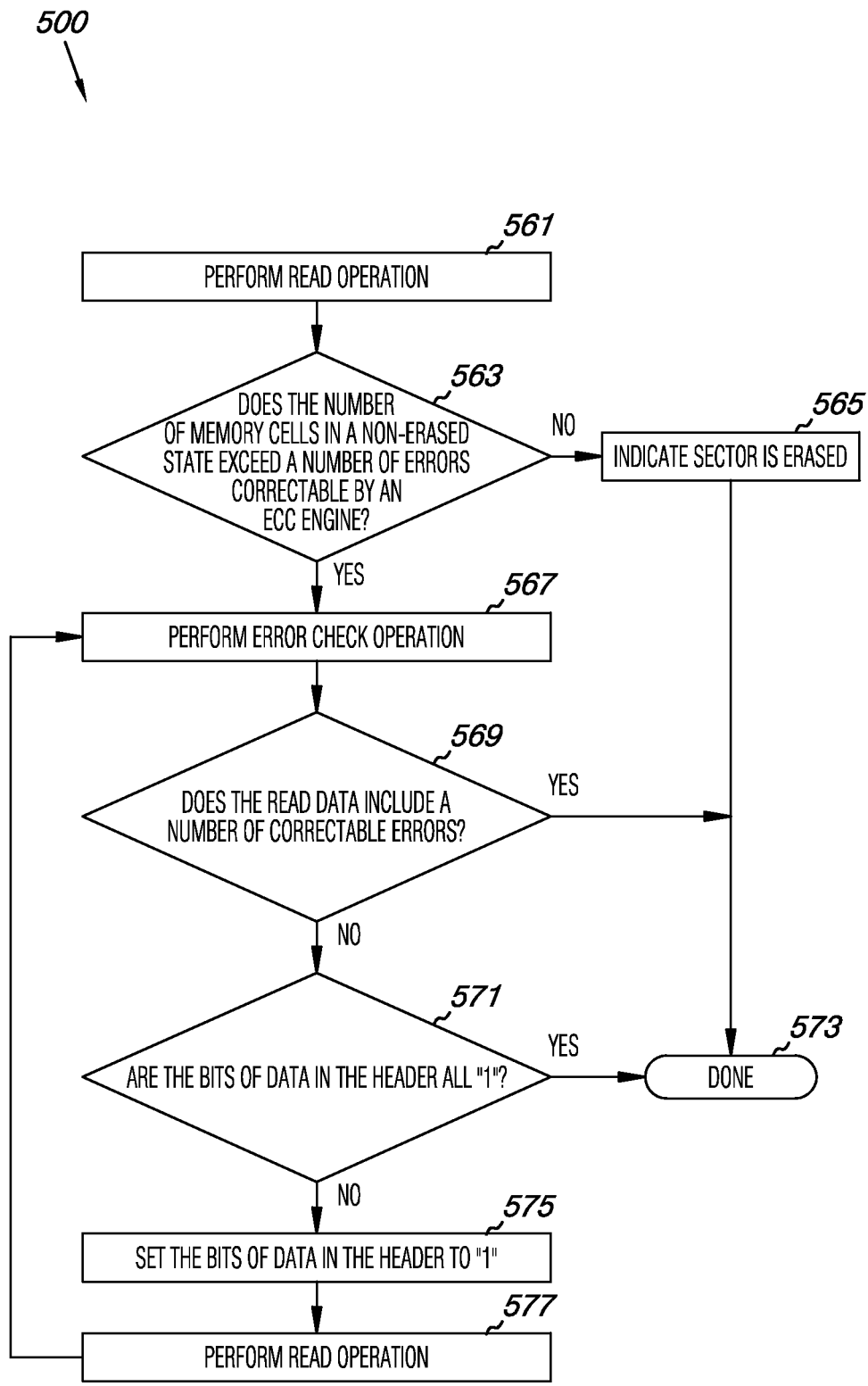
FIG. 5 is a flow chart illustrating a method for operating a memory device in accordance with a number of embodiments of the present disclosure.

FIG. 5 is a flow chart 500 illustrating a method for operating a memory device, e.g., memory device 300 shown in FIG. 3, in accordance with a number of embodiments of the present disclosure. In a number of embodiments, the memory device can be a solid state memory device, such as a solid state drive or other solid state memory device. In a number of embodiments, the method illustrated by flow chart 500 can be used to determine a status of a number of logical sectors of data associated with a memory array, e.g., memory array 102 shown in FIG. 1 and/or memory array 348 shown in FIG. 3.

At step 561, a read operation is performed on a memory array. In a number of embodiments, the read operation can be performed to read data from a number of memory cells corresponding to a logical sector of data, e.g., a logical sector corresponding to one of physical sectors 122-0, 122-1, . . . , 122-S shown in FIG. 1 and/or a logical sector associated with data 222 shown in FIG. 2. In a number of embodiments, the logical sector can be associated with a header portion and/or a payload portion. For example, the logical sector can be associated with header portion 226 and/or payload portion 227 shown in FIG. 2. The logical sector can also be associated with an extension portion, such as extension portion 228 shown in FIG. 2.

If the read operation determines at step 563 that the number of memory cells in a non-erased state is less than or equal to, e.g., does not exceed, a number of errors correctable by an ECC engine, e.g., ECC engine 345 shown in FIG. 3, it is determined that the sector is in an erased state and an indicator having a status indicating the sector is erased is provided at step 565, and the operation is concluded at step 573. The indicator can be provided by, for example, counter and/or logic circuitry 349 shown in FIG. 3. In a number of embodiments, whether the number of memory cells in a non-erased state exceeds a number of errors correctable by the ECC engine can be determined by a module, such as counter and/or logic circuitry 349 shown in FIG. 3.

If the read operation determines at step 563 that the number of memory cells in a non-erased state is greater than, e.g., exceeds, a number of errors correctable by an ECC engine, e.g., ECC engine 345 shown in FIG. 3, an error check operation is performed on the data read in association with the read operation at step 567. In a number of embodiments, the error check operation can be performed by an ECC engine, such as ECC engine 345 shown in FIG. 3. In a number of embodiments, performing the error check operation can include adding an error correction portion, such as error correction portion 229 shown in FIG. 2, to the data associated with the logical sector.

A determination of whether the read data includes a number of correctable errors is made at step 569. In a number of embodiments, this determination can be made by an ECC engine, such as ECC engine 345 shown in FIG. 3. In a number of embodiments, this determination can include determining whether the read data includes a number of errors, and determining whether the number of errors exceeds a particular number, e.g., a maximum number of errors the ECC engine is capable of correcting. If the number of errors exceeds the particular number, the errors are determined to be uncorrectable. If the number of errors does not exceed, e.g., is less than or equal to, the particular number, the errors are determined to be correctable.

If the read data includes a number of correctable errors, a controller, e.g., memory controller 340 shown in FIG. 3, can determine that the sector is in a non-erased state and an indicator having a status indicating the sector is erased is not provided, and the operation is concluded at step 573. If the read data is uncorrectable, a determination of whether the header is in a reset or default state, e.g., the bits of data in the header are all "1", is made at step 571. If the bits of data in the header are all "1", a controller, e.g., memory controller 340, can determine that the sector is in a non-erased state and an indicator having a status indicating the sector is erased is not provided, and the operation is concluded at step 573.

If the bits of data in the header are not all "1", e.g., a number of bits of data in the header are "0", the header is reset, e.g., the bits of data in the header are all set to "1", at step 575, a read operation is performed on the same physical sector at step 577, and the operation returns to step 567. In a number of embodiments, the read operation performed at step 577 can be analogous to the read operation performed at step 561.

Figure 6:
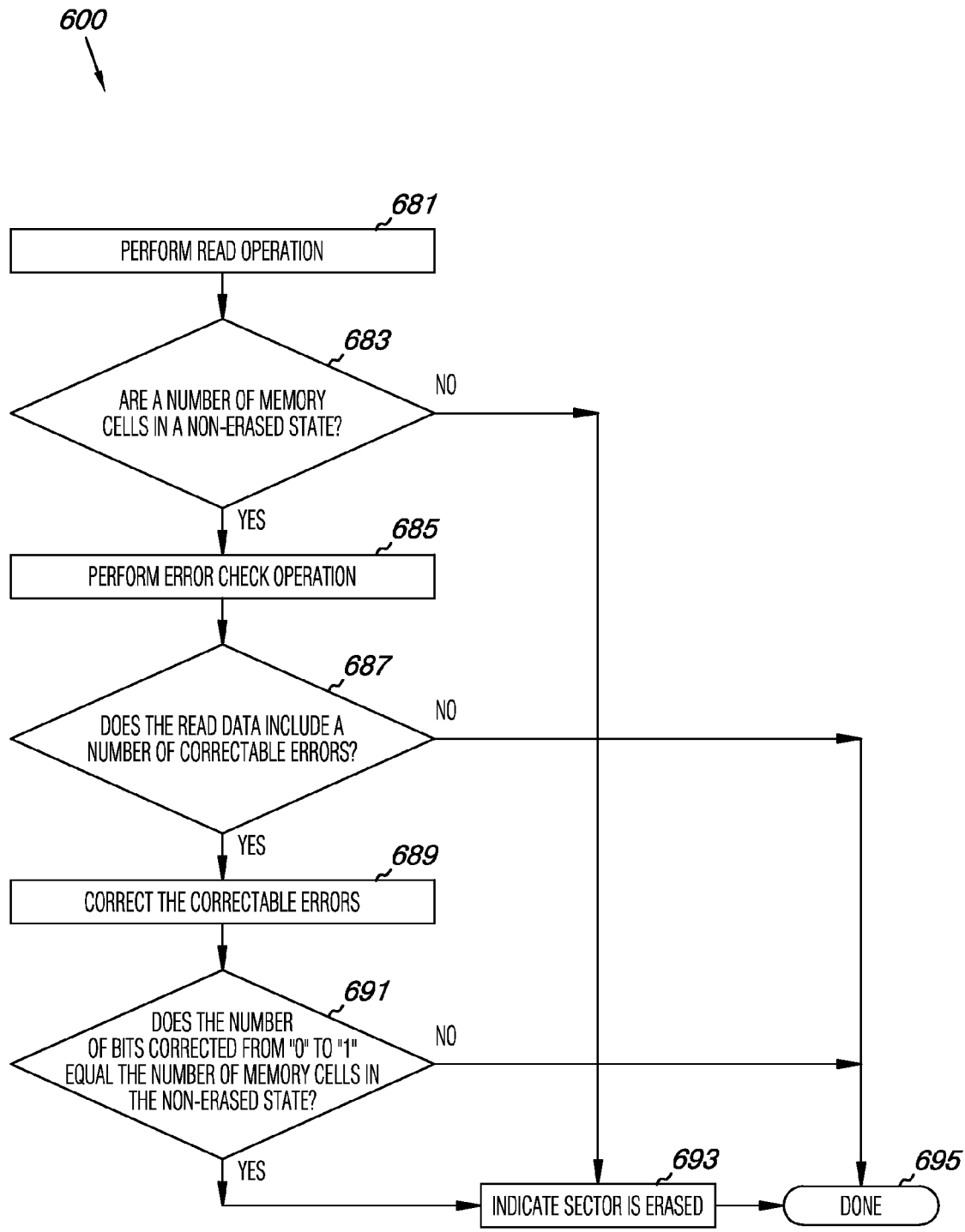
FIG. 6 is a flow chart illustrating a method for operating a memory device in accordance with a number of embodiments of the present disclosure.

FIG. 6 is a flow chart 600 illustrating a method for operating a memory device, e.g., memory device 300 shown in FIG. 3, in accordance with a number of embodiments of the present disclosure. In a number of embodiments, the memory device can be a solid state memory device, such as a solid state drive or other solid state memory device. In a number of embodiments, the method illustrated by flow chart 600 can be used to determine a status of a number of logical sectors of data associated with a memory array, e.g., memory array 102 shown in FIG. 1 and/or memory array 348 shown in FIG. 3.

At step 681, a read operation is performed on a memory array. In a number of embodiments, the read operation can be performed to read data from a number of memory cells corresponding to a logical sector of data, e.g., a logical sector corresponding to one of physical sectors 122-0, 122-1, ..., 122-S shown in FIG. 1 and/or a logical sector associated with data 222 shown in FIG. 2. In a number of embodiments, the logical sector can be associated with a payload portion and/or an extension portion. For example, the logical sector can be associated with payload portion 227 and/or extension portion 228 shown in FIG. 2. However, the logical sector is not associated with a header portion.

If the read operation determines at step 683 that none of the memory cells corresponding to the logical sector are in a non-erased state, e.g., that all of the memory cells corresponding to the logical sector are in an erased state, it is determined that the sector is in an erased state and an indicator having a status indicating the sector is erased is provided at step 693, and the operation is concluded at step 695. The indicator can be provided by, for example, counter and/or logic circuitry 349 shown in FIG. 3.

If the read operation determines at step 683 that a number of the memory cells corresponding to the logical sector are in a non-erased state, an error check operation is performed on the data read in association with the read operation at step 685. In a number of embodiments, whether a number of the memory cells are in a non-erased state and/or the number of memory cells in a non-erased state can be determined by a module, such as counter and/or logic circuitry 349 shown in FIG. 3. In a number of embodiments, the error check operation can be performed by an ECC engine, such as ECC engine 345 shown in FIG. 3. In a number of embodiments, performing the error check operation can include adding an error correction portion, such as error correction portion 229 shown in FIG. 2, to the data associated with the logical sector.

A determination of whether the read data includes a number of correctable errors is made at step 687. In a number of embodiments, this determination can be made by an ECC engine, such as ECC engine 345 shown in FIG. 3. In a number of embodiments, this determination can include determining whether the read data includes a number of errors, and determining whether the number of errors exceeds a particular number, e.g., a maximum number of errors the ECC engine is capable of correcting. If the number of errors exceeds the particular number, the errors are determined to be uncorrectable. If the number of errors does not exceed, e.g., is less than or equal to, the particular number, the errors are determined to be correctable.

If the read data is uncorrectable, a controller, e.g., memory controller 340 shown in FIG. 3, can not determine whether the sector is in an erased state and an indicator having a status indicating the sector is erased is not provided, and the operation is concluded at step 695. If the read data includes a number of correctable errors, the correctable errors are corrected at step 689. In a number of embodiments, the error correction can be performed by an ECC engine, such as ECC engine 345 shown in FIG. 3.

A determination of whether the number of bits of data corrected, e.g., the number of bits of data corrected from "0" to "1", equals the number of memory cells determined to be in the non-erased state in association with the read operation is made at step 691. If the number of bits of data corrected from "0" to "1" equals the number of memory cells determined to be in the non-erased state, it is determined that the sector is in an erased state and an indicator having a status indicating the sector is erased is provided at step 693, and the operation is concluded at step 695. The indicator can be provided by, for example, counter and/or logic circuitry 349 shown in FIG. 3. If the number of bits of data corrected from "0" to "1" does not equal the number of memory cells determined to be in the non-erased state, a controller, e.g., memory controller 340, can determine that the sector is not in an erased state and an indicator having a status indicating the sector is erased is not provided, and the operation is concluded at step 695.

CONCLUSION

The present disclosure includes methods, devices, and systems for operating semiconductor memory. A number of method embodiments include reading data from memory cells corresponding to a sector of data, determining a number of the memory cells in a non-erased state, and, if the number of the memory cells in a non-erased state is less than or equal to a number of errors correctable by an ECC engine, determining the sector is erased.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for determining sector status in a memory device, comprising:
    reading data from memory cells corresponding to a sector of data;
    determining a number of the memory cells in a non-erased state;
    if the number of the memory cells in a non-erased state is less than or equal to a number of errors correctable by an error correction code (ECC) engine, determining the sector is erased, wherein the number of errors correctable by the ECC engine is based on a minimum distance between two block codes associated with the ECC engine; and
    if the sector is determined to be erased, providing an indicator having a status indicating the sector is erased.

2. The method of claim 1, wherein the method includes, if the number of the memory cells in a non-erased state is not less than or equal to the number of errors correctable by the ECC engine:
    error checking the read data;
    determining whether the read data includes a number of correctable errors; and if the read data includes a number of correctable errors, not providing an indicator having a status indicating the sector is erased.

3. The method of claim 2, wherein determining whether the read data includes a number of correctable errors includes:
   determining a number of errors in the read data; and
   determining whether the number of errors in the read data exceeds a particular number.

4. The method of claim 2, wherein the method includes, if the read data does not include a number of correctable errors:
   determining whether a header portion associated with the sector of data is in a reset or default state; and
   if the header portion is not in a reset or default state:
     resetting the header portion; and
     reading data from the memory cells corresponding to the sector of data after resetting the header portion.

5. The method of claim 1, wherein the method includes using a controller to:
   read the data from the memory cells corresponding to the sector of data;
   determine the number of the memory cells in the non-erased state;
   determine the sector is erased; and
   provide the indicator having a status indicating the sector is erased.

6. A memory device, comprising:
   a plurality of memory cells corresponding to a sector of data; and
   a controller coupled to the plurality of memory cells, wherein the controller is configured to:
     perform a read operation to read data from the plurality of memory cells;
     if a number of the plurality of memory cells are determined to be in a non-erased state, determine whether the number of the plurality of memory cells in a non-erased state is less than or equal to a number of errors correctable by an error correction code (ECC) engine, wherein the number of errors correctable by the ECC engine is based on a number of locations which differ between two block codes associated with the ECC engine;
     if the number of the plurality of memory cells in a non-erased state is less than or equal to the number of errors correctable by the ECC engine, determine the sector is erased; and
     if the sector is determined to be erased, provide an indicator having a status indicating the sector is erased.

7. The memory device of claim 6, wherein the sector of data is associated with a payload portion, wherein the payload portion includes data stored in the plurality of memory cells corresponding to the sector of data.

8. The memory device of claim 6, wherein the sector of data is associated with an extension portion, wherein the extension portion includes data relating to the plurality of memory cells corresponding to the sector of data.

9. The memory device of claim 6, wherein the sector of data is associated with a header portion, wherein the header portion includes a logical block address of the plurality of memory cells corresponding to the sector of data.

10. The memory device of claim 6, wherein the sector of data is associated with an error correction portion, wherein the error correction portion includes data used to detect and/or correct errors associated with the plurality of memory cells corresponding to the sector of data.

11. A method for determining sector status in a memory device, comprising:
   reading data from memory cells corresponding to a sector of data;
   determining a number of the memory cells that are in a non-erased state;
   correcting correctable errors in the read data;
   comparing the number of the memory cells determined to be in a non-erased state with a number of bits of data corrected in association with correcting the correctable errors in the read data, wherein the comparison includes determining whether the number of memory cells determined to be in a non-erased state is equal to the number of bits of data corrected in association with correcting the correctable errors in the read data; and
   determining whether the sector is erased based on the comparison.

12. The method of claim 11, wherein the sector is erased if the number of memory cells determined to be in a non-erased state is equal to the number of bits of data corrected in association with correcting the correctable errors in the read data.

13. The method of claim 11, wherein the method includes providing an indicator having a status indicating the sector is erased if the number of memory cells determined to be in a non-erased state is equal to the number of bits of data corrected in association with correcting the correctable errors in the read data.

14. The method of claim 11, wherein the method includes not providing an indicator having a status indicating the sector is erased if the number of memory cells determined to be in a non-erased state is not equal to the number of bits of data corrected in association with correcting the correctable errors in the read data.

15. The method of claim 11, wherein the method includes providing an indicator having a status indicating the sector is erased if all of the memory cells are determined to be in an erased state.

16. A memory device, comprising:
   a plurality of memory cells corresponding to a sector of data; and
   a controller coupled to the plurality of memory cells, wherein the controller is configured to:
     determine a number of the memory cells that are in a non-erased state;
     correct correctable errors in the sector of data;
     count the number of corrected errors;
     compare the number of memory cells determined to be in a non-erased state with the number of corrected errors, wherein the comparison includes a determination of whether the number of memory cells determined to be in a non-erased state is equal to the number of corrected errors; and
     determine whether the sector is erased based on the comparison.

17. The memory device of claim 16, wherein the sector is erased if the number of memory cells determined to be in a non-erased state is equal to the number of corrected errors.

18. The memory device of claim 17, wherein the controller is configured to provide an indicator having a status indicating the sector is determined to be erased if the number of memory cells determined to be in a non-erased state is equal to the number of corrected errors.

19. The memory device of claim 16, wherein the controller includes a module configured to:
   determine the number of the memory cells that are in a non-erased state; and
   count the number of corrected errors.

20. The memory device of claim 16, wherein the controller includes an error correction code (ECC) engine configured to correct the correctable errors in the sector of data.

* * * * *